United States Patent
Chen et al.

(10) Patent No.: US 7,003,419 B2
(45) Date of Patent: Feb. 21, 2006

(54) CARD FOR TESTING FUNCTIONS OF CARD INTERFACE

(75) Inventors: Jen-De Chen, Taoyuan (TW); Yung-Ming Lu, Taoyuan (TW)

(73) Assignee: High Tech Computer Corp., Taoyuan (TW)

( * ) Notice: Subject to any disclaimer, the term of this patent is extended or adjusted under 35 U.S.C. 154(b) by 113 days.

(21) Appl. No.: 10/606,842

(22) Filed: Jun. 27, 2003

(65) Prior Publication Data

US 2004/0138848 A1 Jul. 15, 2004

(30) Foreign Application Priority Data

Jan. 13, 2003 (TW) ............... 92100644 A

(51) Int. Cl.
*G01R 35/00* (2006.01)
(52) U.S. Cl. ...................... 702/108; 702/120
(58) Field of Classification Search ............... 702/108, 702/110, 118, 120, 122; 710/14, 48, 58
See application file for complete search history.

(56) References Cited

U.S. PATENT DOCUMENTS

| | | | | |
|---|---|---|---|---|
| 4,618,920 A | * | 10/1986 | Fox ........................... 363/37 |
| 4,888,585 A | * | 12/1989 | Kamiya et al. .......... 340/10.34 |
| 5,561,628 A | * | 10/1996 | Terada et al. .......... 365/185.04 |
| 5,818,029 A | * | 10/1998 | Thomson .................... 235/486 |
| 6,064,721 A | * | 5/2000 | Mohammadian et al. ..... 379/21 |
| 6,148,347 A | * | 11/2000 | Finch et al. ................. 710/14 |
| 6,370,594 B1 | * | 4/2002 | Chang et al. ................. 710/3 |
| 6,480,907 B1 | * | 11/2002 | Chen et al. ................. 710/15 |
| 6,536,670 B1 | * | 3/2003 | Postman et al. ........... 235/487 |
| 2003/0073915 A1 | * | 4/2003 | McLeod et al. ............ 600/509 |
| 2003/0204656 A1 | * | 10/2003 | Ha ............................. 710/301 |
| 2004/0268194 A1 | * | 12/2004 | Kao et al. .................... 714/724 |

* cited by examiner

*Primary Examiner*—Marc S. Hoff
*Assistant Examiner*—Anthony Gutierrez
(74) *Attorney, Agent, or Firm*—Rabin & Berdo, P.C.

(57) ABSTRACT

A card for testing functions of the card interface of an electronic device is provided. The testing card includes a converting circuit, a latch circuit, a data processor, a signal generator, an oscillation combination circuit, and a reset circuit is provided. The converting circuit is coupled to the card interface. The latch circuit receives the data signal fed in from the card interface, latches the data signal and outputs it to the data processor afterwards. Having received the signal sent from the converting circuit and the latch circuit, the data processor is able to proceed with testing. The signal generator can output the mode selection signal and the interrupt signal to the card interface to test the functions of mode selection and interrupt signals. Furthermore, the oscillation combination circuit can generate a wait signal and feed the wait signal to the card interface for the wait test.

19 Claims, 4 Drawing Sheets

CARD FOR TESTING FUNCTIONS OF CARD INTERFACE

This application claims the benefit of Taiwan application Serial No. 92100644, filed Jan. 13, 2003.

BACKGROUND OF THE INVENTION

1. Field of the Invention

The invention relates in general to a testing card, and more particularly to an integrated testing card.

2. Description of the Related Art

With the rapid advance in science and technology, a large variety of electronic products have been developed in recent years. Take the personal digital assistant (PDA) for example. Within only a few years' time, its screen has been upgraded from mono-color screen to full-color screen; its size is further reduced while its functions are further augmented. Nowadays, the PDA has almost become an indispensable handy device to business people.

To satisfy its user's strong need for function augmentation, a PDA is normally equipped with at least one card interface for the augmentation of functions. For example, a personal computer memory card international association card (PCMCIA card) or a compact flash card (CF card) can be used as a memory card or an input/output card (I/O card) to enhance the function of a PDA. The abovementioned I/O card can be a modem card for instance.

From the manufacturer's point of view, a product must pass a series of inspections and tests to assure its quality before the product is allowed to leave the factory. The function test of the card interface is a very important test to be performed. Whatever card interface an electronic product may use, no matter it is a PCMCIA card, a CF card or other card interfaces, the card interface used must have memory support and I/O support functions to satisfy the user's diverse needs of augmentation. The most common way of testing is conducted by using ordinary memory card and I/O card respectively to test the memory function and the I/O function of a card interface. During the process of testing, the memory card will be inserted into the card slot for memory access test and will be removed from the card slot after memory test is finished; then the I/O card will be inserted into the card slot to test the input/output signal. Despite that the inspector has already tested the memory function and I/O function of a card interface using a memory card and an I/O card respectively, there are always some signals to be tested being left out. For example, if mode selection signal IOIS16, wait signals WAIT and interrupt signal INT are left out, the reliability of quality assurance will decrease. Besides, to test the interface memory and the interface I/O function of testing card, the inspector needs to use a memory card and an I/O card respectively, not only a longer duration of test is needed but also a smooth flow of testing process will be interrupted. For example, excluding the loading/unloading time, it still takes 7 seconds to test the ATA-Type memory card and 25 seconds to test the I/O card.

SUMMARY OF THE INVENTION

It is therefore an object of the invention to provide a testing card which integrates all interface signals to be tested such as memory signals and input/output signals into a single card to shorten the testing time and simplify the testing process as well.

According to the object of the present invention, a testing card is provided and disclosed below.

The testing card is used to be coupled to the card interface installed in an electronic device to test the function of the card interface. The testing card comprises a converting circuit, a latch circuit, a data processor, a signal generator, an oscillation combination circuit, and a reset circuit. The converting circuit is used to receive the attribute control signal, the common memory signal and the input/output signal fed in from the card interface, convert these signals and output them to the data processor afterwards. The latch circuit is used to receive the data signal fed in from the card interface, latch the data signal and output it to the data processor afterwards. Having received the signal sent from the converting circuit and the latch circuit, the data processor will be able to proceed with testing accordingly. The signal generator can output the mode selection signal and the interrupt signal to the card interface to test the functions of mode selection and interrupt signals. Furthermore, the signal generator outputs the enable signal to the oscillation combination circuit according to the control signal fed in from the card interface, so that the oscillation combination circuit can generate a wait signal according to the enable signal and feed the wait signal to the card interface for testing purpose. The reset circuit is used to reset the above latch circuit, data processor, signal generator and oscillation combination circuit to start the testing process again.

The testing process performed by the testing card according to the present invention includes the following procedures:

Firstly, identify the testing card. Perform 16 bits I/O addressing mode test if the identification is successful; otherwise display an error message if the identification fails. Next, proceed with 16 bits attribute addressing mode test if the 16 bits I/O addressing mode test is successful; otherwise, display an error message if the 16 bits I/O addressing mode test fails. Perform memory addressing mode test if the 16 bits I/O attribute addressing mode test is successful; otherwise, display an error message if the 16 bits I/O memory addressing mode test fails. Set the testing mode to 8 bits and perform 8 bits I/O addressing mode test if the memory addressing mode is successful; otherwise, display an error message if the memory addressing mode test fails. Perform wait signal test if the 8 bits I/O addressing mode test is successful; otherwise, display an error message if the 8 bits I/O addressing mode test fails. During the wait signal test, first of all, the wait signal is enabled and counting process is executed; after that, the wait signal is disabled, the counting process is executed. Meanwhile, whether the wait signal complies with the standard or not will be determined according to the difference between the counting result obtained when the wait signal is enabled and the counting result obtained when the wait signal is disabled. Conclude the testing process if the wait signal complies with the standard; otherwise, display an error message if the wait signal fails to meet the standard.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
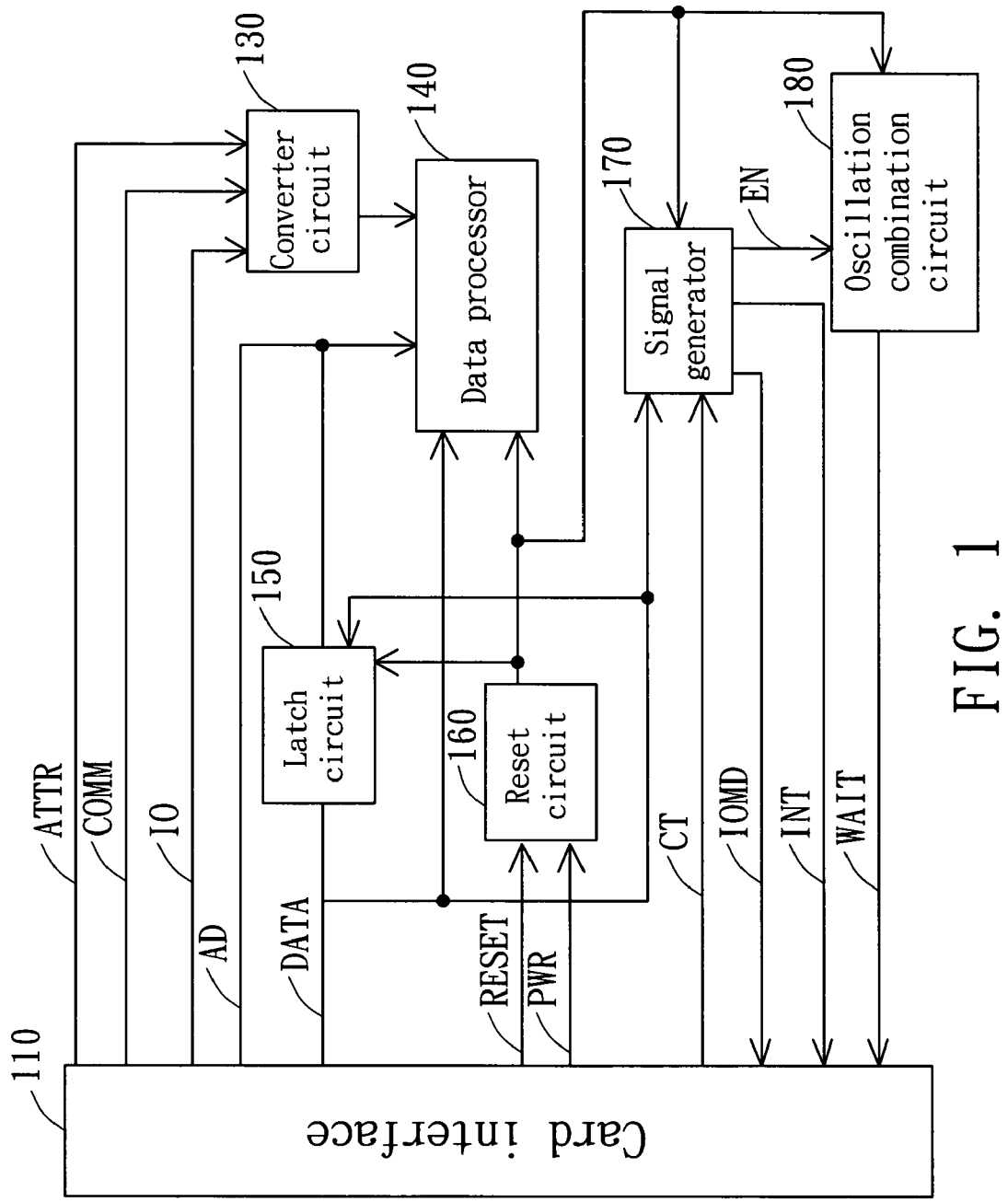
FIG. 1 is a block diagram for a testing card according to a preferred embodiment of the invention.

Please refer to FIG. 1, a block diagram for a testing card according to a preferred embodiment of the present invention. The testing card is used to be coupled to card interface 110 installed in an electronic device to test the functions of card interface 110 wherein the electronic device can be a personal digital assistant for instance. The testing card includes converting circuit 130, latch circuit 150, data processor 140, signal generator 170, oscillation combination circuit 180 and reset circuit 160, wherein data processor 140 can be embodied using a flash memory and can measure interface signals using the firmware burnt onto data processor 140. For the testing card to test both memory function and I/O function, converting circuit 130 must be able to process attribute control signal ATTR, common memory signal COMM and input/output signal 10 coming from card interface 110. Conventionally, only attribute control signal ATTR and common memory signal COMM can be tested during memory card testing, while only attribute control signal ATTR and input/output signal 10 can be tested during input/output signal testing. Compared with the conventional testing method which cannot test attribute control signal ATTR, common memory signal COMM and input/output signal at the same time, converting circuit 130 according to the invention can test the three signals at the same time, integrating the memory function testing and the input/output signal function testing together.

Latch circuit 150 can latch data signal DATA coming from card interface 110. The memory function testing and the input/output signal function testing can be performed when the data signal DATA is fed into data processor 140 in conjunction with address signal AD. As the testing process proceeds, data processor 140 will sequentially test 16 bits input/output signal IO, 16 bits attribute control signal ATTR, common memory signal COMM and 8 bits input/output signal IO. The testing process will be further elaborated below.

Signal generator 170 generates mode selection signal IOMD and interrupt signal INT, the two signals that cannot be obtained in conventional testing process by inserting either a memory card or an I/O card. The invention uses signal generator 170 to generate both mode selection signal IOMD and interrupt signal INT, then feed the two signals into card interface 110 in conjunction with the firmware of the data processor so that the operation of selection signal IOMD and interrupt signal INT can be tested and determined.

Moreover, signal generator 170 can generate enable signal EN according to control signal CT fed in from card interface 110, and feed the enable signal EN to oscillation combination circuit 180 to generate wait signal WAIT wherein enable signal EN can be a negative trigger signal. When enable signal EN is at high levels, wait signal WAIT will be at high levels as well and will be disabled accordingly. At the same time, the CPU operation capacity of the electronic device will not be interfered with. Data processor 140 can set the CPU to count a pre-determined number, 1000 for instance, and record the time needed to finish the counting, say, T1 for instance. When enable signal EN drops from a high level to a low level, oscillation combination circuit 180 will generate a square-wave signal with high level signals alternating with low level signals. Wait signal WAIT will be enabled when it is at low levels, so CPU will stop when wait signal WAIT is at low levels. The operation speed of CPU will slow down when the square-wave signal which enables wait signal WAIT intermittently is fed into the CPU. Meanwhile, data processor 140 can again set the CPU to count a pre-determined number, say, 1000 for instance, and record the time needed to finish the counting, say, T2 for instance. Subtract T2 from T1 and examine the difference, whether the operation of wait signal WAIT complies with the standard or not can thus be determined. By doing so, whether wait signal WAIT function normally or not can also be determined.

The function of reset circuit 160 is to reset these latch circuit 150, data processor 140, signal generator 170 and oscillation combination circuit 180, so that the testing card can re-start testing for next card interface 110.

Figure 2A:
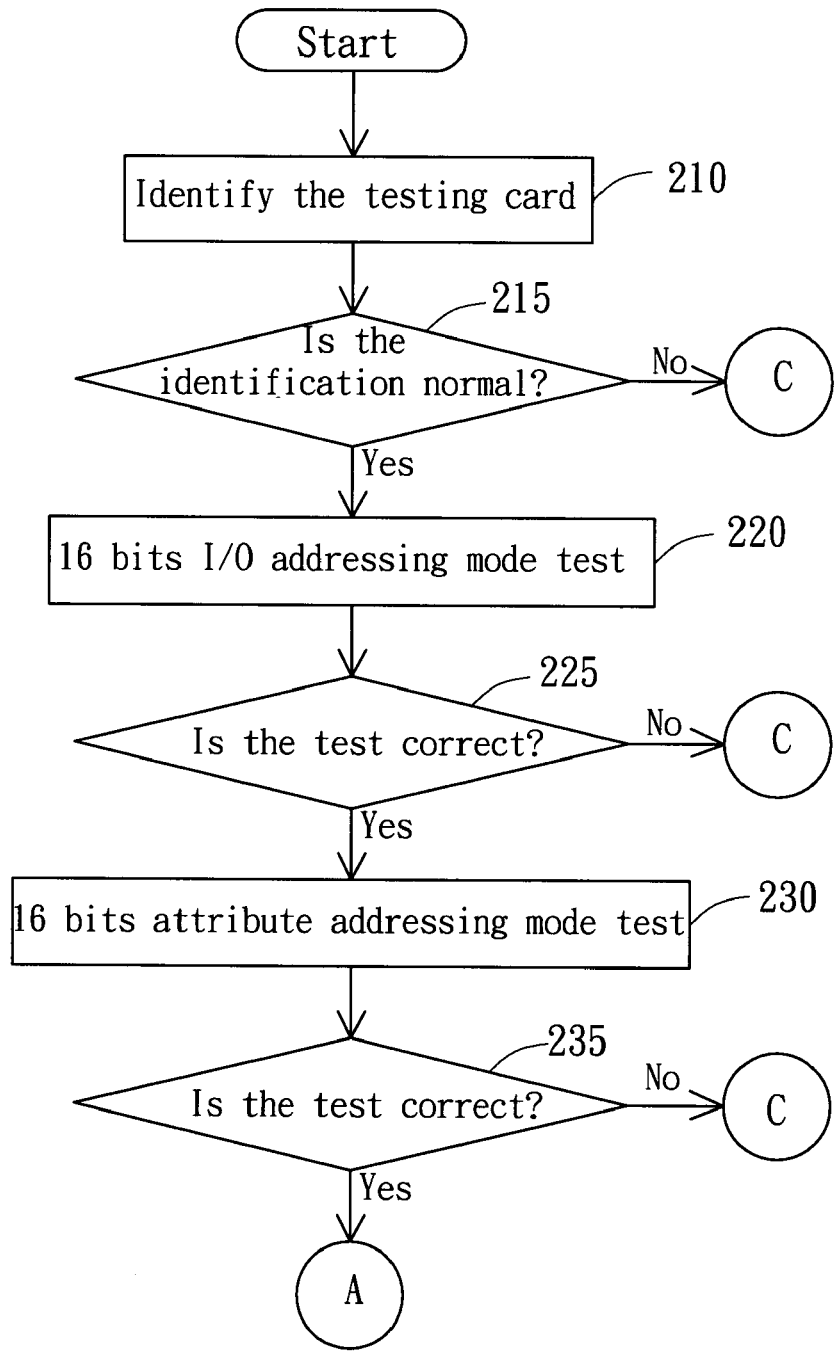
FIGS. 2A~2C are flowcharts showing testing method performed by the testing card in FIG. 1.
Figure 2B:
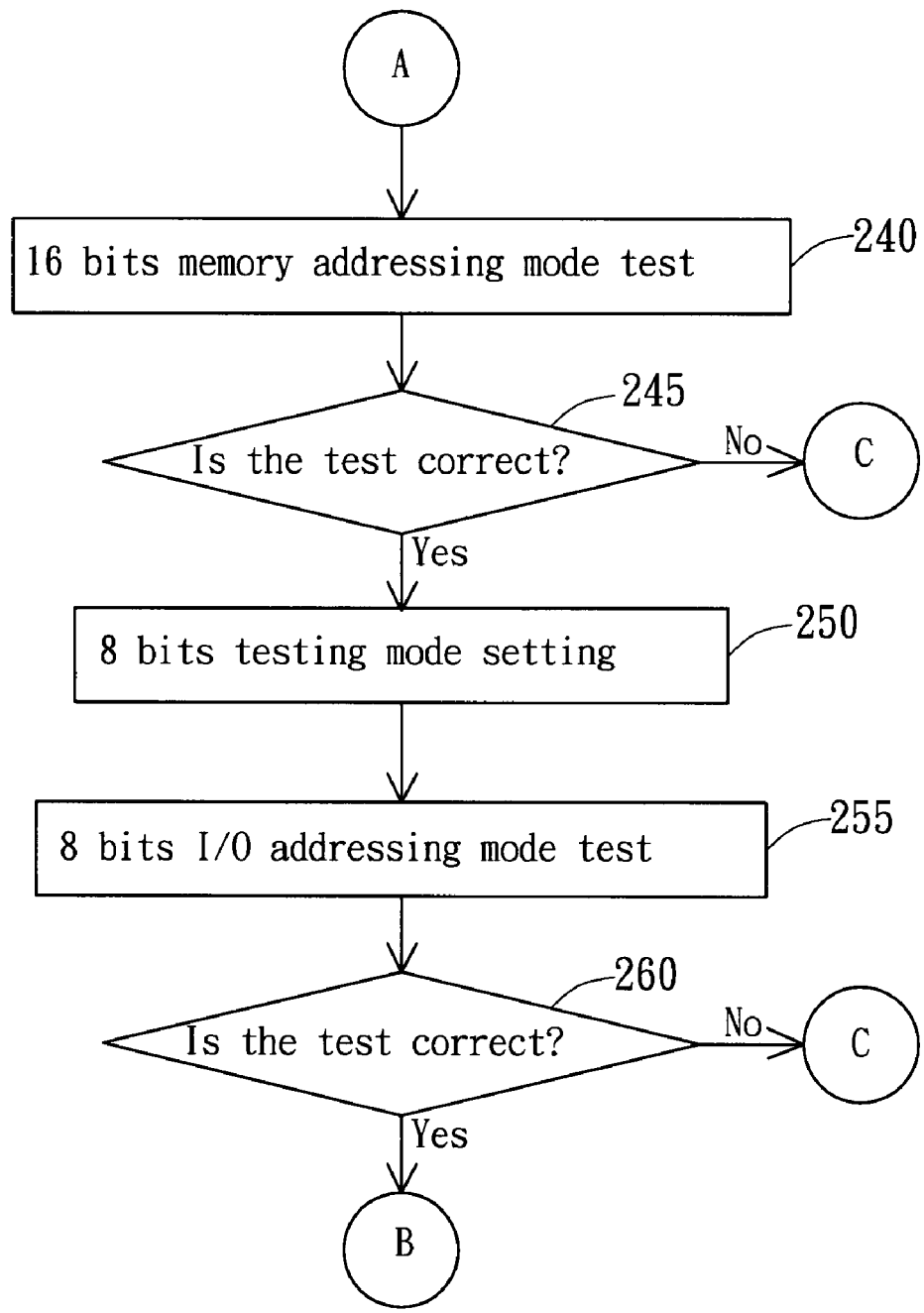
Figure 2C:
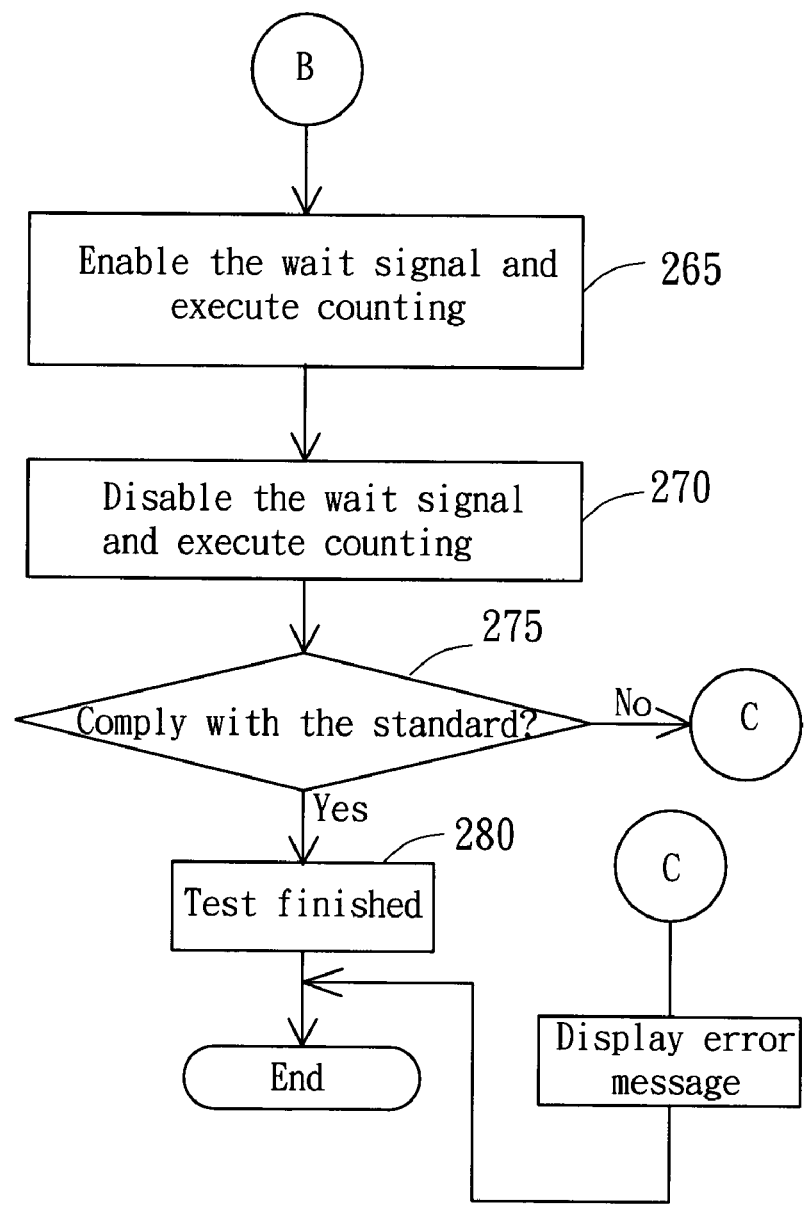

Please refer to FIGS. 2A~2C, flowcharts showing testing method performed by the testing card in FIG. 1. Firstly, identify the testing card (step 210). If the identification is successful, perform 16 bits I/O addressing mode test for the test of 16 bits input/output signal IO (step 215, 220); otherwise display an error message if the identification fails. Meanwhile, mode selection signal IOMD can be set at a low level to test the erase signal, the write signal, the read signal and the compare signal. The 16 bits I/O addressing mode test covers address signals of lower levels, data signals, PIOW signals and PIOR signals of input/output signal IO.

If the 16 bits I/O addressing mode test is successful (step 225), proceed with 16 bits attribute addressing mode for the test of 16 bits attribute control signal ATTR (step 230); otherwise, display an error message if the 16 bits I/O addressing mode test fails. The 16 bits attribute addressing mode test, which tests the erase signal, the write signal, the read signal and the compare signal, covers the PWE signal and POE signal of attribute control signal ATTR.

If 16 bits I/O attribute addressing mode test is successful (step 235), perform memory addressing mode test (step 240); otherwise, display an error message if 16 bits I/O memory addressing mode test fails. Memory addressing mode test, which covers higher level address and data signals, can test the common memory signal. If memory addressing mode test is successful (step 245), set mode selection mode IOMD at high levels and set testing mode to be at 8 bits (step 250) to proceed with 8 bits I/O addressing mode test (step 255); otherwise, display an error message if memory addressing mode test fails. The 8 bits addressing mode test, which tests the erase signal, the write signal, the read signal and the compare signal, covers various testing results obtained when mode selection signal IOMD is set at high levels.

If 8 bits I/O addressing mode test is successful (step 260), perform wait signal test; otherwise, display an error message if the 8 bits I/O addressing mode test fails. Firstly, use the square wave as wait signal WAIT which can be enabled, and set the CPU to count a pre-determined number, 1000 for instance, and record the time needed to finish the counting, say, T2 for instance, (step 265). Next, continue to set wait signal WAIT at high levels; wait signal WAIT is actually disabled. Again, set the CPU to count a pre-determined number, 1000 for instance, and record the time needed to finish the counting, say, T1 for instance, (step 270). Whether wait signal WAIT complies with the standard or not can thus be determined according to the difference (T2−T1) which is obtained when wait signal WAIT is enabled and disabled respectively (step 275). If the standard has been met, conclude the testing process (step 280); otherwise, display an error message.

The testing card disclosed in the above preferred embodiment according to the invention can be applied to various operating systems such as WinCE, Palm or Linux. For the abovementioned testing structure and process to be applied to various operating systems, only slight firmware modifications for respective data processor are needed. For those who are familiar with this technology, such conversion is not a problem at all.

To summarize the above disclosures, the testing card according to the preferred embodiment of the invention has at least the following advantages:

1. that the memory signal and the input/output signal being tested at the same time saves a large amount of testing time and testing process;

2. that only one single testing card is needed to complete memory test and input/output signal test makes it much cheaper compared with the conventional testing method which requires a memory card and an I/O card respectively;

3. that a wider range of hardware interface signals including mode selection signal, interrupt signal and wait signal etc. can be tested; and 4. that the use of flash memory as an embodiment of data processor provides upgrading and storage functions for the testing program.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A testing card for coupling to a card interface installed in an electronic device to test functions of the card interface, wherein the card interface complies with an interface specification, the testing card comprising:

a converting circuit for receiving, converting and outputting an attribute control signal, a common memory signal and an I/O signal fed in from the card interface;

a latch circuit for receiving a data signal fed in from the card interface, latching the data signal and having data signal outputted afterwards;

a data processor, coupled to the converting circuit and the latch circuit, for proceeding with testing;

a signal generator to for outputting a mode selection signal and an interrupt signal to the card interface, and to generate and output an enable signal according to a control signal fed in from the card interface;

an oscillation combination circuit, which is coupled to the signal generator and is used to generate a wait signal according to the enable signal and feed the wait signal into the card interface; and a reset circuit, which is coupled to the latch circuit, the data processor, the signal generator and the oscillation combination circuit and is used to reset the above latch circuit, the data processor, the signal generator and the oscillation combination circuit.

wherein the data processor performs an I/O addressing mode test according to the I/O signal, the data signal and the mode selection signal;

wherein the data processor performs an attribute addressing mode test according to the attribute control signal;

wherein the data processor performs a memory addressing mode test according to the common memory signal and the data signal;

wherein the data processor performs a wait test according to the wait signal; and wherein the data processor performs an interrupt test according to the interrupt signal.

2. The testing card according to claim 1, wherein the electronic device is a personal digital assistant.

3. The testing card according to claim 2, wherein the personal digital assistant adopts WinCE operating system.

4. The testing card according to claim 1, wherein the interface is of personal computer memory card international association specification (PCMCIA specification).

5. The testing card according to claim 1, wherein the interface is of compact flash specification (CF specification).

6. The testing card according to claim 1, wherein the data processor is a flash memory.

7. The testing card according to claim 1, wherein the enable signal is a negative trigger signal.

8. The testing card according to claim 1, wherein the wait signal is a square-wave signal.

9. The testing card according to claim 1, wherein the testing method performed by the testing card comprises the steps of:

identifying the testing card: displaying an error message if identification fails, otherwise proceeding with step A;

A. proceeding with 16 bits I/O addressing mode test: displaying an error message if the test fails, otherwise proceeding with step B;

B. proceeding with 16 bits attribute addressing mode test: displaying an error message if the test fails, otherwise proceeding with step C;

C. proceeding with memory addressing mode test: displaying an error message if the test fails, otherwise proceeding with step D;

D. setting the test to be 8 bits testing mode;

E. proceeding with 8 bits I/O addressing mode test: displaying an error message if the test fails, otherwise proceeding with step F;

F. enabling the wait signal and executing counting;

G. disabling the wait signal and executing counting; and determining if the wait signal complies with the standard value according to the values of counting obtained in step F and step G respectively: if no, displaying an error message; if yes, concluding the testing process.

10. The testing card according to claim 9, wherein the enable signal is a negative trigger signal.

11. The testing card according to claim 10, wherein the I/O addressing mode test is in 8 bits if the mode selection signal is at a second level.

12. The testing card according to claim 9, wherein the wait signal is a square-wave signal.

13. The testing card according to claim 1, wherein in the wait test, the data processor outputs the wait signal to a CPU of the electronic device, and receives the time that the CPU takes to count a predetermined number for determining the correctness of a wait function.

14. The testing card according claim 1, wherein the I/O addressing mode test is in 16 bits if the mode selection signal is at a first level.

15. A testing system, coupled to a card interface installed in an electronic device to test a function of the card interface, wherein the card interface complies with an interface specification, the testing system comprising:

a converting circuit which is used to receive, convert and output an attribute control signal, a common memory signal and an I/O signal fed in from the card interface;

a latch circuit which is used to receive a data signal fed in from the card interface, latch the data signal and have the data signal outputted afterwards;

a data processor which is coupled to the converting circuit and the latch circuit and is used to proceed with testing according to the data signal and the signal outputted from the converting circuit, wherein the data processor will perform testing system identification when the card interface is inserted into the testing system: displaying an error message if the identification fails, otherwise proceeding with step A if the identification is successful;

A. proceeding with 16 bits I/O addressing mode test of the I/O signal: displaying an error message if the test fails, otherwise proceeding with step B;
B. proceeding with 16 bits attribute addressing mode test of the control signal: displaying an error message if the test fails, otherwise proceeding with step C;
C. proceeding with 16 bits memory addressing mode test of the common memory signal: displaying an error message if the test fails, otherwise proceeding with step D;
D. setting the test to be 8 bits testing mode;
E. proceeding with 8 bits I/O addressing mode test of the I/O signal and displaying an error message if the test fails;

a signal generator which is used to output a mode selection signal and an interrupt signal to the card interface, and, according to a control signal fed in from the card interface, generate an enable signal and have the enable signal outputted afterwards;

an oscillation combination circuit, which is coupled to the signal generator and is used to generate a wait signal according to the enable signal and feed the wait signal to the card interface, wherein the oscillation combination circuit outputs the wait signal according to the enable signal to execute counting processing, and, after the counting is finished, the wait signal is disabled and the counting processing is executed again, and wherein the data processor determines if the wait signal complies with the standard according to the values of counting obtained when the wait signal is enabled and disabled respectively; and a reset circuit, which is coupled to the latch circuit, the data processor, the signal generator and the oscillation combination circuit and is used to reset the above latch circuit, the data processor, the signal generator and the oscillation combination circuit.

16. The testing system according to claim 15, wherein the electronic device is a personal digital assistant.

17. The testing system according to claim 15, wherein the personal digital assistant adopts WinCE operating system.

18. The testing system according to claim 15, wherein the enable signal is a negative trigger signal.

19. The testing system according to claim 15, wherein the wait signal is a square-wave signal.

* * * * *